(12) United States Patent
Andersson et al.

(10) Patent No.: US 9,923,341 B1
(45) Date of Patent: Mar. 20, 2018

(54) TRACK POWER SUPPLY SYSTEM

(71) Applicants: Henrik B. Andersson, Naples, FL (US); Magnus C. Petermann, Lidingö (SE)

(72) Inventors: Henrik B. Andersson, Naples, FL (US); Magnus C. Petermann, Lidingö (SE)

(73) Assignee: INSTORESCREEN, LLC, Fort Myers, FL (US)

( * ) Notice: Subject to any disclaimer, the term of this patent is extended or adjusted under 35 U.S.C. 154(b) by 0 days.

(21) Appl. No.: 15/420,202

(22) Filed: Jan. 31, 2017

Related U.S. Application Data

(60) Provisional application No. 62/336,926, filed on May 16, 2016.

(51) Int. Cl.
| | |
|---|---|
| *H02B 1/052* | (2006.01) |
| *H02B 1/20* | (2006.01) |
| *G06K 7/10* | (2006.01) |
| *G06K 9/26* | (2006.01) |
| *H05K 1/02* | (2006.01) |
| *H05K 1/18* | (2006.01) |

(52) U.S. Cl.
CPC ......... *H02B 1/052* (2013.01); *G06K 7/10732* (2013.01); *G06K 9/26* (2013.01); *H02B 1/205* (2013.01); *H05K 1/0262* (2013.01); *H05K 1/18* (2013.01)

(58) Field of Classification Search
CPC ..... H01L 2224/45015; H01L 2924/181; H01L 2224/45; H01L 2224/49; H01L 2224/78; G06K 7/10732; G06K 9/26; G11B 33/128; H05K 1/0262; H05K 1/0263; H05K 1/18; H05K 2201/10492; H05K 2201/1053; H02B 1/04; H02B 1/044; H02B 1/048; H02B 1/052; H02B 1/0523; H02B 1/0526; H02B 1/205

See application file for complete search history.

(56) References Cited

U.S. PATENT DOCUMENTS

| | | | | |
|---|---|---|---|---|
| 3,832,503 | A | | 8/1974 | Crane |
| 4,139,252 | A | * | 2/1979 | Gorny ................. H01R 25/142 200/51.07 |
| 4,655,520 | A | * | 4/1987 | Cummings ........... F21V 21/002 439/111 |
| 4,790,766 | A | | 12/1988 | Booty, Sr. et al. |
| 5,306,165 | A | * | 4/1994 | Nadeau ................. H01R 25/14 439/115 |
| 5,599,086 | A | | 2/1997 | Dutta |
| 5,759,051 | A | * | 6/1998 | Cancellieri .......... H01R 25/142 439/118 |
| D399,594 | S | | 10/1998 | Patik |
| 6,089,884 | A | | 7/2000 | Klaus |

(Continued)

*Primary Examiner* — Adam B Dravininkas
(74) *Attorney, Agent, or Firm* — Livingston Loeffler, P.A.; Edward M. Livingston, Esq.; Bryan L. Loeffler, Esq.

(57) ABSTRACT

A track power supply system (1) that extends and provides power to various electronic devices or components in a display areas of a retail setting wherein 110 volt hardwired electrical components would be difficult and/or uneconomical to install. Components may include lights, LEDs, USB ports and so forth as well as various supplies for powering the track. Each component attaches via a pressure fit into channels of the track.

18 Claims, 4 Drawing Sheets

(56) References Cited

U.S. PATENT DOCUMENTS

| | | | | |
|---|---|---|---|---|
| 6,644,988 B2* | 11/2003 | Healy | ............... | H01R 25/14 |
| | | | | 439/120 |
| 6,716,042 B2* | 4/2004 | Lin | ............... | H01R 25/14 |
| | | | | 362/147 |
| D649,683 S | 11/2011 | Trzesniowski | | |
| D649,684 S | 11/2011 | Trzesniowski | | |
| D649,692 S | 11/2011 | Trzesniowski | | |
| D652,986 S | 1/2012 | Trzesniowski | | |
| 8,915,609 B1* | 12/2014 | Shah | ............... | F21S 8/035 |
| | | | | 362/183 |
| 2003/0103347 A1* | 6/2003 | Friend | ............... | F21V 21/002 |
| | | | | 362/225 |
| 2004/0160767 A1* | 8/2004 | Mobarak | ............... | F21V 21/35 |
| | | | | 362/219 |
| 2008/0106892 A1* | 5/2008 | Griffiths | ............... | F21V 11/10 |
| | | | | 362/223 |
| 2013/0020164 A1* | 1/2013 | Asplund | ............... | B60L 5/40 |
| | | | | 191/29 R |

* cited by examiner

TRACK POWER SUPPLY SYSTEM

CROSS-REFERENCE TO RELATED APPLICATIONS

This application claims priority to U.S. provisional patent application No. 62/336,926 filed on May 16, 2016. The provisional patent application identified above is incorporated herein by reference in its entirety to provide continuity of disclosure.

FIELD OF THE INVENTION

This invention relates to power supply systems for retail store displays and other applications where conventional 110 volt power outlets are difficult and/or costly to install.

BACKGROUND OF THE INVENTION

Display areas in retail settings typically include audible and/or visual presentations of information, such as information pertaining to products on a shelf or to displays. In many cases, different electronic devices are placed at or along shelves and/or display areas, such as lights, display screens and so forth. These electronic devices are preferably powered by low voltage power supplies, such as 12 or 6 volts power supplies that are separately plugged into one or more 110 volt outlets at or near the display. Thus, multiple 110 volt lines and outlets may be needed for any given shelving unit and/or display. This requires the installation of 110 volt power outlets, which is costly and time consuming and can take valuable retail space due to the need for posts running from the ceiling to the floor. This is especially time consuming given the fact that many jurisdictions require work permits to install additional 110 volt power outlets. In addition, the installation of additional 110 volt power outlets requires the retail space to be closed off and power to be shut down to a particular space during installation.

Therefore, a need exists for a track power supply system that extends and provides power to various electronic devices or components in a display area using existing 110 volt power outlets.

The relevant prior art includes the following references:

| Pat. No. (U.S. patent References) | Inventor | Issue/Publication Date |
|---|---|---|
| 3,832,503 | Crane | Aug. 27, 1974 |
| 4,139,252 | Gorny | Feb. 13, 1979 |
| 4,790,766 | Booty, Sr. et al. | Dec. 13, 1988 |
| 5,599,086 | Dutta | Feb. 4, 1997 |
| 5,759,051 | Cancellieri et al. | Jun. 2, 1998 |
| D399,594 | Patik | Oct. 13, 1998 |
| 6,089,884 | Klaus | Jul. 18, 2000 |
| D649,683 | Trzesniowski | Nov. 29, 2011 |
| D649,684 | Trzesniowski | Nov. 29, 2011 |
| D649,692 | Trzesniowski | Nov. 29, 2011 |
| D652,986 | Trzesniowski | Jan. 24, 2012 |

SUMMARY OF THE INVENTION

The primary object of the present invention is to provide a track power supply system that extends and provides power to various electronic devices or components in a display area using existing 110 volt power outlets.

The present invention fulfills the above and other objects by providing a track power supply system comprising an elongated track having a substantially U-shaped housing that houses two channels, each running the length of the track. The two channels each have a positive electrical lead and a negative electrical lead, respectively, embedded therein. A dividing wall extends upward from an inner surface of the U-shaped housing and runs the the length of the elongated track to divide the two channels. The dividing wall provides attachment points and separates the positive and negative leads embedded within the two channels. In addition, access openings into the channels are specially designed to prevent individuals from inserting fingers into the track and making contact with the positive and negative electrical leads. The dividing wall also allows the openings of the channels to be varied so that a negative channel is narrower than a positive channel (or vice versa) to prevent components from being attached to the track incorrectly. The opening of the track is also specially shaped and designed with an angled opening to allow a probe to be inserted into a desired channel to test the track and negative or positive lead.

Components may include lights, LEDs, USB ports and so forth as well as various supplies for powering the track. Each component attaches via a pressure fit created by inserting rectangular-shaped prongs into the channels of the track. Leads on the prongs may vary in size depending on the power being supplied to the track or being used by an electrical input component or used by an electrical output component.

The tracks may be used in various installations, such as retrofitting existing shelving and displays of a retail setting wherein 110 volt hardwired electrical components would be difficult and/or uneconomical to install.

The above and other objects, features and advantages of the present invention should become even more readily apparent to those skilled in the art upon a reading of the following detailed description in conjunction with the drawings wherein there is shown and described illustrative embodiments of the invention.

BRIEF DESCRIPTION OF THE DRAWINGS

In the following detailed description, reference will be made to the attached drawings in which.

DESCRIPTION OF THE PREFERRED EMBODIMENTS

Figure 1:
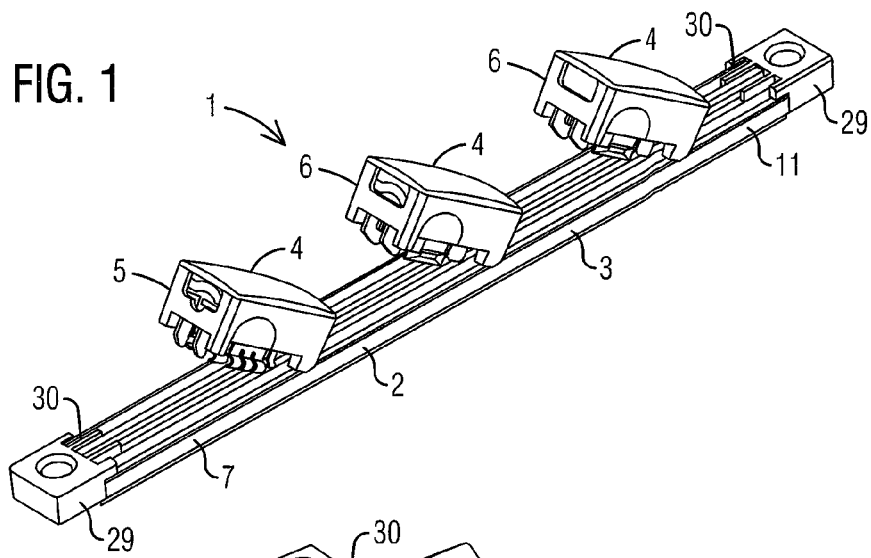
FIG. 1 is a front perspective view of a track power supply system of the present invention wherein electronic components are being attached to an elongated track.

For purposes of describing the preferred embodiment, the terminology used in reference to the numbered accessories in the drawings is as follows:
1. track power supply system, generally
2. elongated track
3. section of elongated track
4. electronic component
5. power input component
6. power output component
7. housing of elongated track
8. rear wall of housing
9. side wall of housing
10. inner surface of housing
11. outer surface of housing
12. electrical lead channel
13. first electrical lead channel
14. second electrical lead channel
15. dividing wall
16. positive female electrical lead
17. negative female electrical lead
18. positive male electrical lead
19. negative male electrical lead
20. locking projection
21. upper edge of side wall of housing
22. inner surface of locking projection
23. positioning channel
24. upper edge of dividing wall
25. first sidewall of positioning channel
26. second sidewall of positioning channel
27. offset groove
28. extender
29. cap
30. end of section
31. base of electronic component
32. upper surface of base
33. lower surface of base
34. clip
35. positioning tab With reference to FIGS. 1-10, the track power supply system 1 of the present invention comprises an elongated track 2 made up of one or more sections 3 and corresponding electronic components 4 that engage the elongated track 2 to provide power to the elongated track 2 as a power input component 5 or to provide outgoing power from the elongated track 2 as a power output component 6.

The elongated track 2 of the present invention comprises a substantially U-shaped housing 7 defined by a rear wall 8 and two side walls 9 each having an inner surface 10 and an outer surface 11. Two U-shaped electrical lead channels 12 comprising a first electrical lead channel 13 and a second electrical lead channel 14 run the length of the elongated track 2 and are defined by the two side walls 9 and the rear wall 8 of the housing 7 and a dividing wall 15 that extends upward form the inner surface 10 of the rear wall 8 and runs the length on the elongated track 2. The electrical lead channels 12 have a positive female electrical lead 16 and a negative female electrical lead 17, respectively, embedded therein. For example, the first electrical lead channel 13 may have a positive female electrical lead 16 and the second electrical lead channel 14 may have the negative female electrical lead 17. The female electrical leads 16, 17 are preferably partially embedded into the side walls 9 of the U-shaped housing 7, thereby leaving a portion of the female electrical leads 16, 17 partially exposed to make contact with corresponding male electrical leads 18, 19 found on the electronic components 4.

Locking projections 20 are located on upper edges 21 of each side wall 9 of the U-shaped housing 7. Each locking projection 20 comprises curved and or angled inner surfaces 22 that extends beyond the inner surfaces 10 of the side walls 9 to partially cover the electrical lead channels 12, thereby providing an engagement means for clipping or locking electronic components 4 into the elongated track 2.

Figure 2:
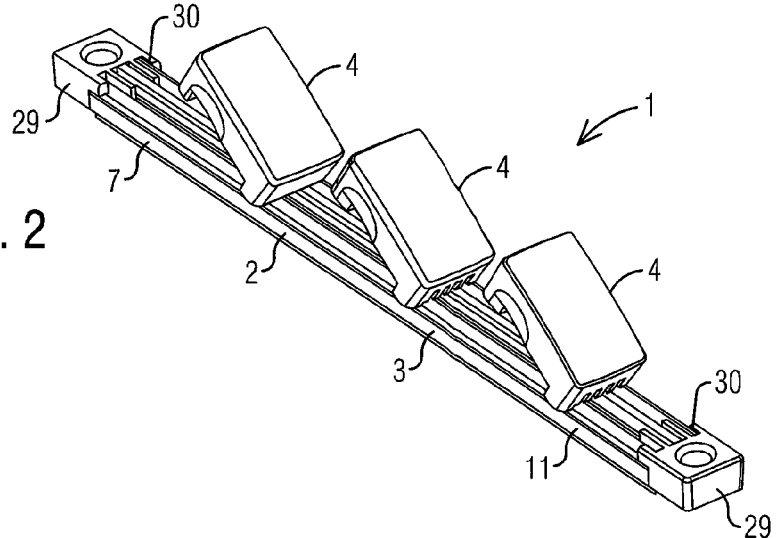
FIG. 2 is a rear perspective view of a track power supply system of the present invention wherein electronic components are being attached to an elongated track.
Figure 3:
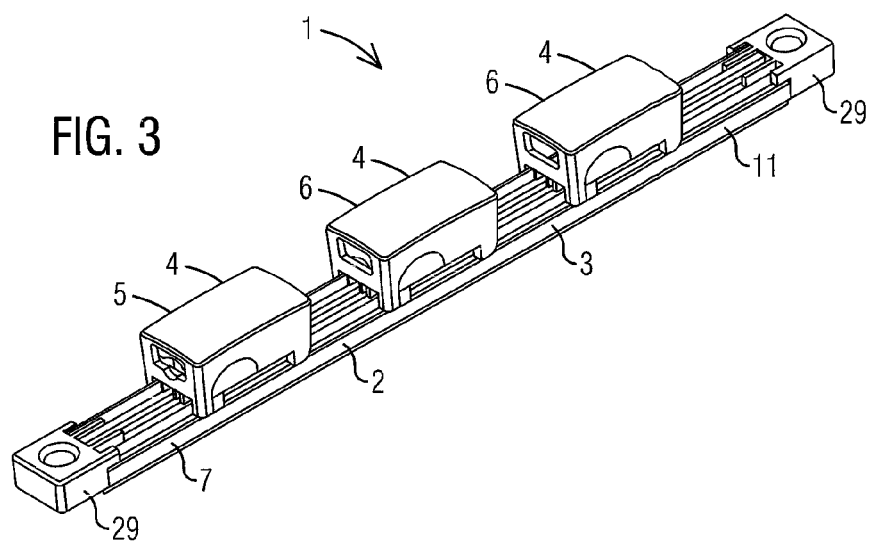
FIG. 3 is a front perspective view of a track power supply system of the present invention wherein electronic components are attached to an elongated track.
Figure 4:
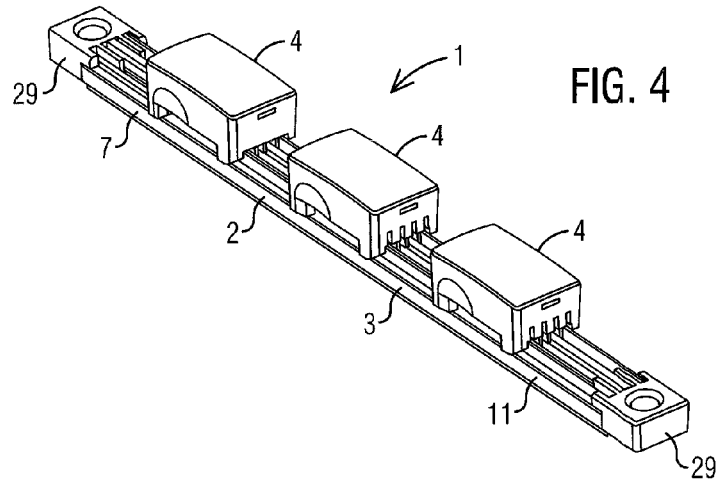
FIG. 4 is a rear perspective view of a track power supply system of the present invention wherein electronic components are attached to an elongated track.
Figure 5:
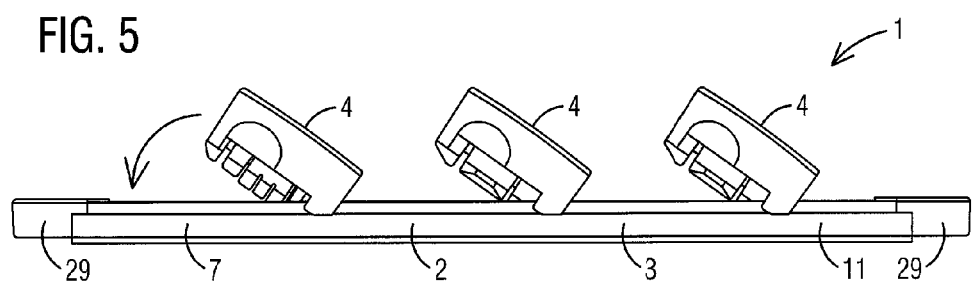
FIG. 5 is a side view of a track power supply system of the present invention wherein electronic components are being attached to an elongated track.
Figure 6:
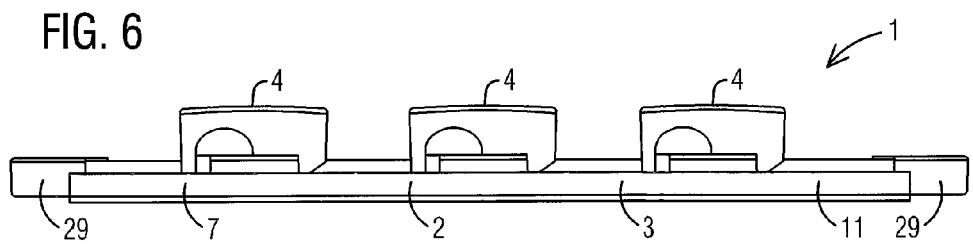
FIG. 6 is a side view of a track power supply system of the present invention wherein electronic components are attached to an elongated track.
Figure 7:
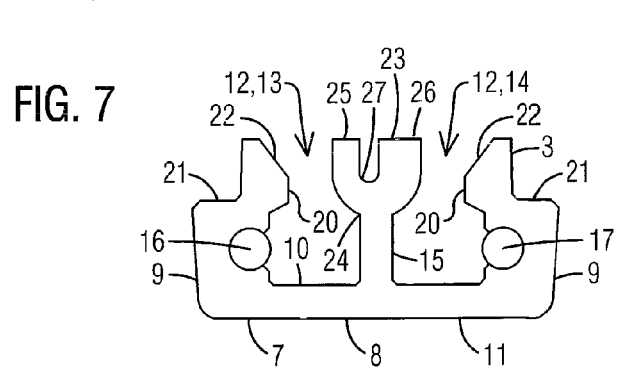
FIG. 7 is an end view of a section of elongated track of the present invention.
Figure 8:
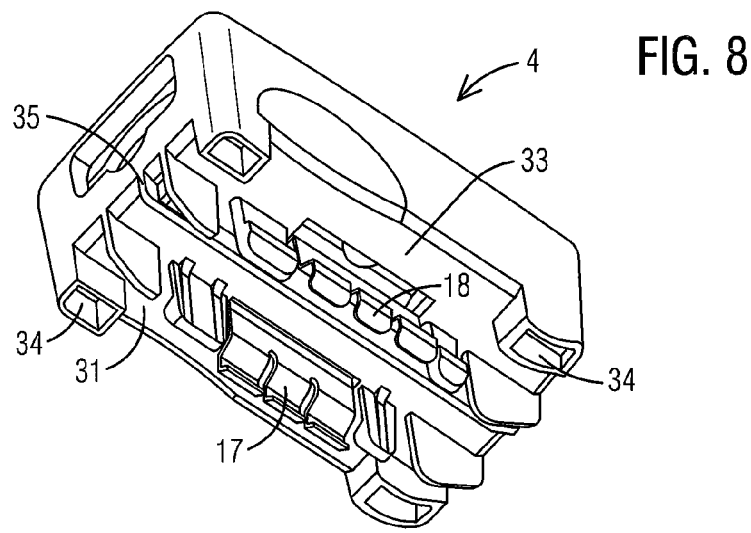
FIG. 8 is a bottom perspective view of an electronic component of the present invention.
Figure 9:
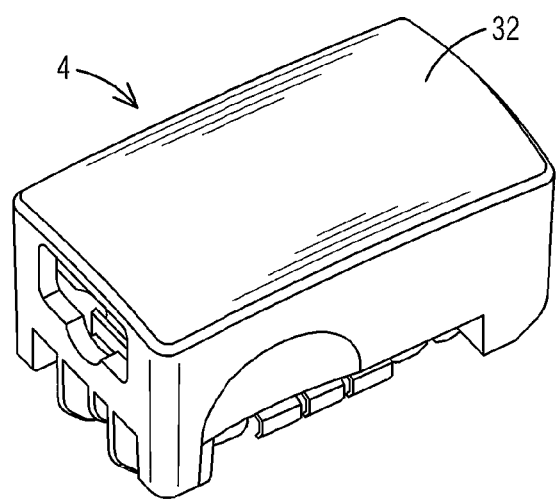
FIG. 9 is a top perspective view of an electronic component of the present invention.
Figure 10:
FIG. 10 is a top view of an electronic component of the present invention.

A U-shaped positioning channel 23 is located on an upper edge 24 of the dividing wall 15. The U-shaped positioning channel 23 comprises a first side wall 25 and a second side wall 26 wherein the first side wall 25 has a width that is less than a width of the second side wall 26 or vice versa to form an offset groove 27 that is off-center in relation to the dividing wall 15. The offset groove 27 prevents electronic components 4 from being inserted into the elongated track 2, thereby ensuring positive electrical leads and negative electrical leads of the electronic component 4 and the elongated track 2 match up and are not reversed, as illustrated in FIGS. 1 and 2.

Figure 11:
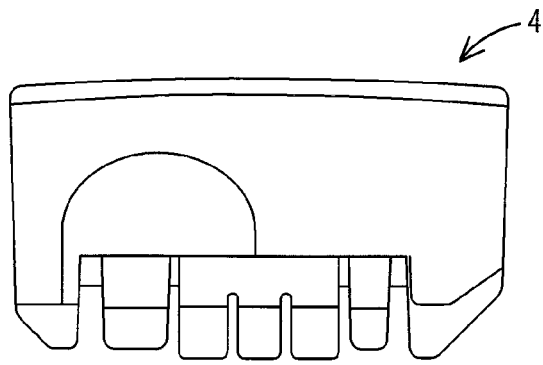
FIG. 11 is a side view of an electronic component of the present invention.
Figure 12:
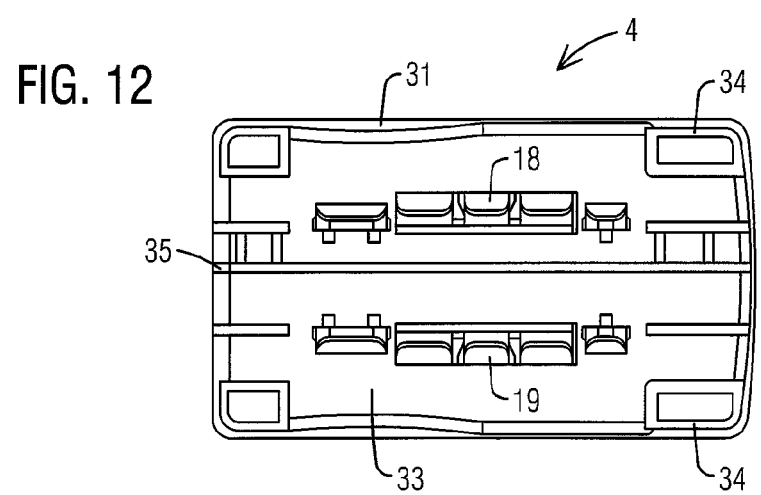
FIG. 12 is a bottom view of an electronic component of the present invention.
Figure 13:
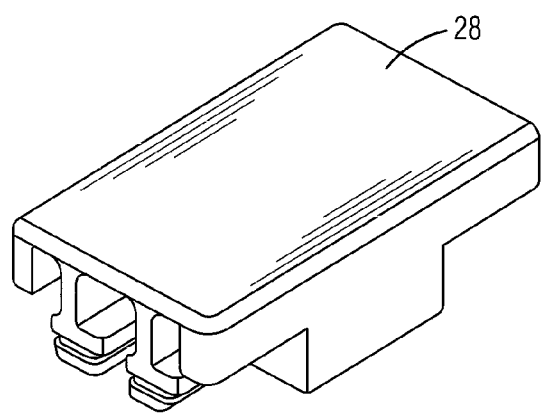
FIG. 13 is a top perspective view of an extender of the present invention.

The elongated track 2 may be extended by securing multiple track sections 3 together using extenders 28, as illustrated in FIG. 11, that engage the U-shaped electrical lead channels 12 of each section 3 and provide connections between the positive electrical leads 16 and negative electrical leads 17 of each section 3. Caps 29 may also be provided and used to cover ends 30 of each elongated track section 3.

Electronic components 4 engage the elongated track 2 to provide power to the elongated track 2 as a power input component 5 or to provide outgoing power from the elongated track 2 as a power output component 6. Electronic components 4 may include lights, LEDs, USB ports and so forth as well as various supplies for powering the track.

Each electronic component 4 comprises a base 31 having an upper surface 32 and a lower surface 33. Clips 34, electrical male leads 18, 19 and positioning tabs 35 extend from the lower surface 33 of the base 31 to engage the 23 the electrical lead channels 12, the female electrical leads 16, 17, and the positioning channel 23, respectively.

Specifically, positive male electrical leads 18 and negative male electrical leads 19 extend from the lower surface 33 of the base 31 and are preferably curved and/or angled outward to allow the electrical male leads 18, 19 of the electronic component 4 to extend under the locking projections 20 located on upper edges 21 of each side wall 9 of the elongated track housing 7 to make contact with the electrical female leads 16, 17 that are partially embedded in the embedded in the electrical lead channels 12. The positive male electrical leads 18 and negative male electrical leads 19 may be enlarged or reduce in size or by number to adjust the contact made with the electrical female leads 16, 17, thereby allowing adjustment of the amount of voltage input or output from the electronic component 4.

In addition, one or more clips 34 extend downward from the lower surface 33 of the base 31. Each clip 34 comprises a curved and/or angled inner surface 36 that engages the locking projections 20 located on upper edges 21 of each side wall 9 of the elongated track housing 7 to lock the electronic component 4 into the elongated track 2.

One or more positioning tabs 35 extend downward from the lower surface 33 of the base 31 and are located between outer rows of the one or more clips 34 and the male electrical leads 18, 19. The one or more positioning tabs 35 are offset from a central axis of the base 31 to engage the U-shaped positioning channel 23 located on upper edge 24 of the dividing wall 15.

It is to be understood that while a preferred embodiment of the invention is illustrated, it is not to be limited to the specific form or arrangement of parts herein described and shown. It will be apparent to those skilled in the art that various changes may be made without departing from the scope of the invention and the invention is not to be considered limited to what is shown and described in the specification and drawings.

We claim:

1. A track power supply system comprising:
    an elongated track made up of one or more sections each comprising a substantially U-shaped housing defined by a rear wall and two side walls each having an inner surface and an outer surface;
    two substantially U-shaped electrical lead channels comprising a first electrical lead channel and a second electrical lead channel that both run a length of the one or more sections of elongated track;
    said substantially U-shaped electrical lead channels being defined by the two side walls and the rear wall of the substantially U-shaped housing and a dividing wall extending upward from the inner surface of the rear wall;
    said dividing wall running the length of the one or more sections of elongated track;
    said first electrical lead channels having a positive female electrical lead located therein;
    said second electrical lead channels having a negative female electrical lead located therein; and
    a U-shaped positioning channel located on an upper edge of the dividing wall.

2. The track power supply system of claim 1 wherein:
    said U-shaped positioning channel forms an offset groove that is off-center in relation to the dividing wall.

3. The track power supply system of claim 1 further comprising:
    at least one locking projection located on an upper edge of each side wall of the U-shaped housing.

4. The track power supply system of claim 1 further comprising:
    at least one electronic component having a base having an upper surface and a lower surface; and
    at least two electrical male leads extending from the lower surface of the base.

5. The track power supply system of claim 4 further comprising:
    at least two clips extending from the lower surface of the base.

6. The track power supply system of claim 4 further comprising:
    at least one positioning tab extending from the lower surface of the base.

7. The track power supply system of claim 6 wherein:
    said at least one positioning tab is offset from a central axis of the base of the electronic component to engage the U-shaped positioning channel.

8. A track power supply system comprising:
    an elongated track made up of one or more sections each comprising a substantially U-shaped housing defined by a rear wall and two side walls each having an inner surface and an outer surface;
    two substantially U-shaped electrical lead channels comprising a first electrical lead channel and a second electrical lead channel that both run a length of the one or more sections of elongated track;
    said substantially U-shaped electrical lead channels being defined by the two side walls and the rear wall of the substantially U-shaped housing and a dividing wall extending upward from the inner surface of the rear wall;
    said dividing wall running the length of the one or more sections of elongated track;
    said first electrical lead channels having a positive female electrical lead located therein;
    said second electrical lead channels having a negative female electrical lead located therein;
    a U-shaped positioning channel located on an upper edge of the dividing wall; and
    said U-shaped positioning channel forms an offset groove that is off-center in relation to the dividing wall.

9. The track power supply system of claim 8 further comprising:
    at least one locking projection located on an upper edge of each side wall of the U-shaped housing.

10. The track power supply system of claim 8 further comprising:
    at least one electronic component having a base having an upper surface and a lower surface; and
    at least two electrical male leads extending from the lower surface of the base.

11. The track power supply system of claim 10 further comprising:
    at least two clips extending from the lower surface of the base.

12. The track power supply system of claim 10 further comprising:
    at least one positioning tab extending from the lower surface of the base.

13. The track power supply system of claim 12 wherein:
    said at least one positioning tab is offset from a central axis of the base of the electronic component to engage the offset groove formed by the U-shaped positioning channel.

14. A track power supply system comprising:
    an elongated track made up of one or more sections each comprising a substantially U-shaped housing defined by a rear wall and two side walls each having an inner surface and an outer surface;
    two substantially U-shaped electrical lead channels comprising a first electrical lead channel and a second electrical lead channel that both run a length of the one or more sections of elongated track;
    said substantially U-shaped electrical lead channels being defined by the two side walls and the rear wall of the substantially U-shaped housing and a dividing wall extending upward from the inner surface of the rear wall;
    said dividing wall running the length of the one or more sections of elongated track;

said first electrical lead channels having a positive female electrical lead located therein;
said second electrical lead channels having a negative female electrical lead located therein;
a U-shaped positioning channel located on an upper edge of the dividing wall;
said U-shaped positioning channel forms an offset groove that is off-center in relation to the dividing wall;
at least one electronic component having a base having an upper surface and a lower surface; and
at least two electrical male leads extending from the lower surface of the base.

15. The track power supply system of claim 14 further comprising:
at least one locking projection located on an upper edge of each side wall of the U-shaped housing.

16. The track power supply system of claim 14 further comprising:
at least two clips extending from the lower surface of the base.

17. The track power supply system of claim 14 further comprising:
at least one positioning tab extending from the lower surface of the base.

18. The track power supply system of claim 17 wherein:
said at least one positioning tab is offset from a central axis of the base of the electronic component to engage the offset groove formed by the U-shaped positioning channel.

* * * * *